(12) United States Patent
Jeong et al.

(10) Patent No.: US 11,182,003 B2
(45) Date of Patent: Nov. 23, 2021

(54) TOUCH SENSOR WITH HIGH SENSITIVITY AND DISPLAY DEVICE HAVING THE SAME

(71) Applicant: Samsung Display Co., Ltd., Yongin-si (KR)

(72) Inventors: Hwan Hee Jeong, Yongin-si (KR); Ki Cheol Kim, Yongin-si (KR); Sung Jae Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/797,904

(22) Filed: Feb. 21, 2020

(65) Prior Publication Data

US 2020/0192514 A1 Jun. 18, 2020

Related U.S. Application Data

(63) Continuation of application No. 15/797,558, filed on Oct. 30, 2017, now Pat. No. 10,572,045.

(30) Foreign Application Priority Data

Apr. 14, 2017 (KR) .................. 10-2017-0048569

(51) Int. Cl.
*G06F 3/041* (2006.01)
*H01L 27/32* (2006.01)
(Continued)

(52) U.S. Cl.
CPC .......... *G06F 3/0412* (2013.01); *G06F 3/0443* (2019.05); *H01L 27/323* (2013.01);
(Continued)

(58) Field of Classification Search
CPC . G06F 2203/04103; G06F 2203/04111; G06F 2203/04112; G06F 3/0412; G06F 3/044; H01L 27/323; H01L 27/3244
See application file for complete search history.

(56) References Cited

U.S. PATENT DOCUMENTS 8,698,767 B2 4/2014 Kwak et al.
8,872,526 B1 * 10/2014 Hoshtanar .......... G01R 27/2605
324/658
(Continued)

FOREIGN PATENT DOCUMENTS

KR 10-2012-0018046 2/2012
KR 10-2013-0115819 10/2013
(Continued)

OTHER PUBLICATIONS

Non-Final Office Action dated Jun. 28, 2019, in U.S. Appl. No. 15/797,558.
(Continued)

*Primary Examiner* — Chun-Nan Lin
(74) *Attorney, Agent, or Firm* — H.C. Park & Associates, PLC

(57) ABSTRACT

A touch sensor, includes: a plurality of sensing rows, each of the plurality of sensing rows including first sensing electrodes connected in a first direction; and a plurality of sensing columns, each of the plurality of sensing columns including second sensing electrodes connected in a second direction crossing the first direction; first protrusions disposed at the first sensing electrodes, the first protrusions protruding toward an adjacent second sensing electrode; and first recesses disposed at the second sensing electrodes, the first recesses facing the first protrusions disposed at an adjacent first sensing electrode, wherein the first recesses have a shape corresponding to a shape of the first protrusions.

24 Claims, 12 Drawing Sheets

(51) Int. Cl.
*H01L 51/00* (2006.01)
*G06F 3/044* (2006.01)

(52) U.S. Cl.
CPC ...... *H01L 27/3276* (2013.01); *H01L 51/0097* (2013.01); *G06F 3/0445* (2019.05); *G06F 2203/04103* (2013.01); *G06F 2203/04111* (2013.01); *G06F 2203/04112* (2013.01); *H01L 27/3244* (2013.01); *H01L 2251/5338* (2013.01)

(56) References Cited

U.S. PATENT DOCUMENTS

| | | | | |
|---|---|---|---|---|
| 9,117,971 | B2 * | 8/2015 | Jeong | H01L 33/24 |
| 9,198,285 | B2 * | 11/2015 | Zhou | H05K 1/0296 |
| 9,201,555 | B2 * | 12/2015 | Anno | G06F 3/044 |
| 9,329,737 | B2 | 5/2016 | Lee et al. | |
| 9,360,971 | B2 * | 6/2016 | Barton | H01B 5/00 |
| 9,842,974 | B2 * | 12/2017 | Jeong | H01L 33/385 |
| 10,008,633 | B2 * | 6/2018 | Park | H01L 33/382 |
| 10,042,493 | B2 * | 8/2018 | Sato | G06F 3/0446 |
| 10,198,120 | B2 * | 2/2019 | Jeon | G06F 3/044 |
| 10,319,792 | B2 * | 6/2019 | Jo | G06F 3/0446 |
| 2013/0207911 | A1 * | 8/2013 | Barton | H03K 17/962 345/173 |
| 2014/0022467 | A1 * | 1/2014 | Chai | G06F 3/044 349/12 |
| 2014/0284082 | A1 * | 9/2014 | Zhou | H05K 1/0296 174/251 |
| 2015/0054788 | A1 * | 2/2015 | Anno | G06F 3/04164 345/174 |
| 2016/0070406 | A1 * | 3/2016 | Han | G06F 3/0443 345/173 |
| 2016/0188039 | A1 * | 6/2016 | Yoon | G06F 3/0414 345/174 |
| 2016/0202792 | A1 * | 7/2016 | Han | G06F 3/044 345/174 |
| 2016/0224181 | A1 * | 8/2016 | Kim | G06F 3/044 |
| 2016/0239133 | A1 * | 8/2016 | Ko | G06F 1/1643 |
| 2016/0246393 | A1 * | 8/2016 | Lee | G06F 3/041 |
| 2016/0378256 | A1 * | 12/2016 | Lee | G06F 3/0412 345/174 |
| 2017/0108964 | A1 * | 4/2017 | Sato | G06F 3/0443 |
| 2017/0168650 | A1 * | 6/2017 | Lee | G02F 1/13439 |
| 2017/0228070 | A1 * | 8/2017 | Roberts | G06F 3/0448 |
| 2017/0228090 | A1 * | 8/2017 | Nakamura | G06F 3/0445 |
| 2017/0336907 | A1 * | 11/2017 | Jeong | G06F 3/044 |
| 2017/0371471 | A1 * | 12/2017 | Kim | G06F 3/0414 |
| 2018/0046292 | A1 * | 2/2018 | Miyazaki | G06F 3/04166 |
| 2018/0120986 | A1 * | 5/2018 | Miyazaki | G06F 3/0412 |
| 2018/0182817 | A1 * | 6/2018 | Jo | H01L 27/15 |
| 2018/0188852 | A1 * | 7/2018 | Choi | G06F 3/0443 |
| 2018/0196543 | A1 * | 7/2018 | Otagaki | H01L 51/5203 |
| 2018/0336387 | A1 * | 11/2018 | Otagaki | G06F 3/0445 |

FOREIGN PATENT DOCUMENTS

| | | |
|---|---|---|
| KR | 10-2014-0016622 | 2/2014 |
| KR | 10-2014-0044118 | 4/2014 |
| KR | 10-2014-0129134 | 11/2014 |
| KR | 10-1543594 | 8/2015 |
| KR | 10-2017-0131755 | 11/2017 |

OTHER PUBLICATIONS

Notice of Allowance dated Oct. 22, 2019, in U.S. Appl. No. 15/797,558.

* cited by examiner

TOUCH SENSOR WITH HIGH SENSITIVITY AND DISPLAY DEVICE HAVING THE SAME

CROSS-REFERENCE TO RELATED APPLICATION

This application is a Continuation of U.S. patent application Ser. No. 15/797,558, filed on Oct. 30, 2017, which claims priority from and the benefit of Korean Patent Application No. 10-2017-0048569, filed on Apr. 14, 2017, each of which is hereby incorporated by reference for all purposes as if fully set forth herein.

BACKGROUND

Field

Various exemplary embodiments relate to a touch sensor and a display device having the same.

Discussion of the Background

Recently, display devices are being equipped with image display function along with information input function. Typically, the information input function may be implemented as a touch sensor for receiving a user's touch input.

The touch sensor may be attached to one surface of a display panel implementing image display function or may be formed as one body with the display panel. A user may input information by pressing or touching the touch sensor while viewing the images implemented on the display panel.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a touch sensor and a display device having the same.

One aspect of the present invention is to provide a touch sensor having enhanced touch sensing sensitivity.

Another aspect of the present invention is to provide a display device including the touch sensor.

In an embodiment, a touch sensor may include a plurality of sensing rows including first sensing electrodes connected in a first direction, a plurality of sensing columns including second sensing electrodes connected in a second direction crossing the first direction, first protrusions disposed at an edge of the first sensing electrodes and protruding toward an adjacent second sensing electrode, a plurality of second protrusions disposed at an edge of the second sensing electrodes, protruding toward an adjacent first sensing electrode and alternately arranged with the first protrusions, first sub protrusions protruding toward an adjacent second protrusion from an edge of the first protrusions and second sub protrusions protruding toward an adjacent first protrusion from an edge of the second protrusions and alternately arranged with the first sub protrusions.

In an embodiment, an area of the first sensing electrodes may be different from an area of the second sensing electrodes.

In an embodiment, the first sensing electrodes and the second sensing electrodes may include a plurality of conductive fine lines crossing each other.

In an embodiment, the touch sensor may further include a pad part including pads electrically connected to the first sensing electrodes and the second sensing electrodes. One of the first sensing electrodes and the second sensing electrodes may receive a driving signal through the pad part, and another one may transmit a touch sense signal to the pad part.

In an embodiment, an area of each of the sensing electrodes receiving the driving signal may be smaller than an area of each of the sensing electrodes transmitting the touch sense signal.

In an embodiment, the sensing electrodes receiving the driving signal may include a first area and a second area, the first area and the second area being electrically separated from each other. One of the first area and the second area may be inside the other and electrically insulated.

In an embodiment, the touch sensor may further include a third protrusion disposed at an edge of the first area and protruding toward the second area and a fourth protrusion disposed at an edge of the second area and protruding toward the first area.

In an embodiment, the third protrusions and the fourth protrusions may be alternately arranged.

In an embodiment, the touch sensor may further include third sub protrusions protruding toward an adjacent fourth protrusion from an edge of the third protrusions and fourth sub protrusions protruding toward an adjacent third protrusion from an edge of the fourth protrusions.

In an embodiment, the third sub protrusions and the fourth sub protrusions may be alternately arranged.

In an embodiment, a distance between adjacent first protrusions may be ⅙ or smaller in length of one side of the first sensing electrode, and a number of the first protrusions disposed at one side of the first sensing electrode may be 6 or more.

In an embodiment, a pitch of the first protrusions and a pitch of the second protrusions are 5 mm or less.

In an embodiment, the first protrusions, the second protrusions, the first sub protrusions and the second sub protrusions may have a closed curve shape having a straight side.

In an embodiment, the touch sensor may further include dummy fine lines between adjacent first sub protrusion and second sub protrusion.

In an embodiment, a height of one of the first protrusions may be different from a height of another one of the first protrusions, and a height of one of the second protrusions may be different from a height of another one of the second protrusions.

In an embodiment, a width of one of the first protrusions may be different from a width of another one of the first protrusions, and a width of one of the second protrusions may be different from a width of another one of the second protrusions.

In an embodiment, the conductive fine lines may include first conductive fine lines extending in a first direction and second conductive fine lines crossing the first conductive fine lines.

In an embodiment, the touch sensor may further include a dummy portion disposed between adjacent first sensing electrode and second sensing electrode and including at least one dummy pattern. The dummy pattern may include at least one first dummy conductive fine line parallel to the first conductive fine lines and a plurality of second dummy conductive fine lines crossing the first dummy conductive fine line and parallel to the second conductive fine line.

In an embodiment, the dummy portion may include two dummy patterns.

In an embodiment, the dummy pattern may include two first dummy conductive fine lines, wherein the second dummy conductive fine lines cross all of the first dummy conductive fine lines.

An exemplary embodiment of the present invention is to provide a display device including a substrate, a light emitting device disposed on the substrate, a display panel including a capping layer covering the light emitting device, and the touch sensor disposed on the display panel. Here, the touch sensor may be disposed on the capping layer.

It is to be understood that both the foregoing general description and the following detailed description are exemplary and explanatory and are intended to provide further explanation of the exemplary embodiments as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
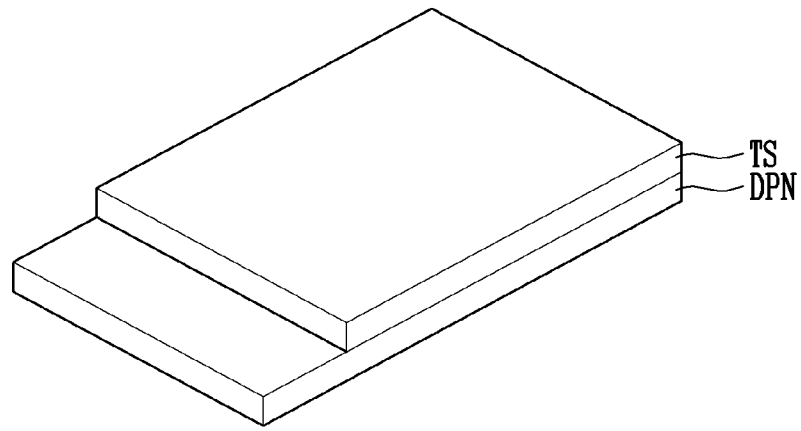
FIG. 1 is a perspective view for describing a display device including a touch sensor according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
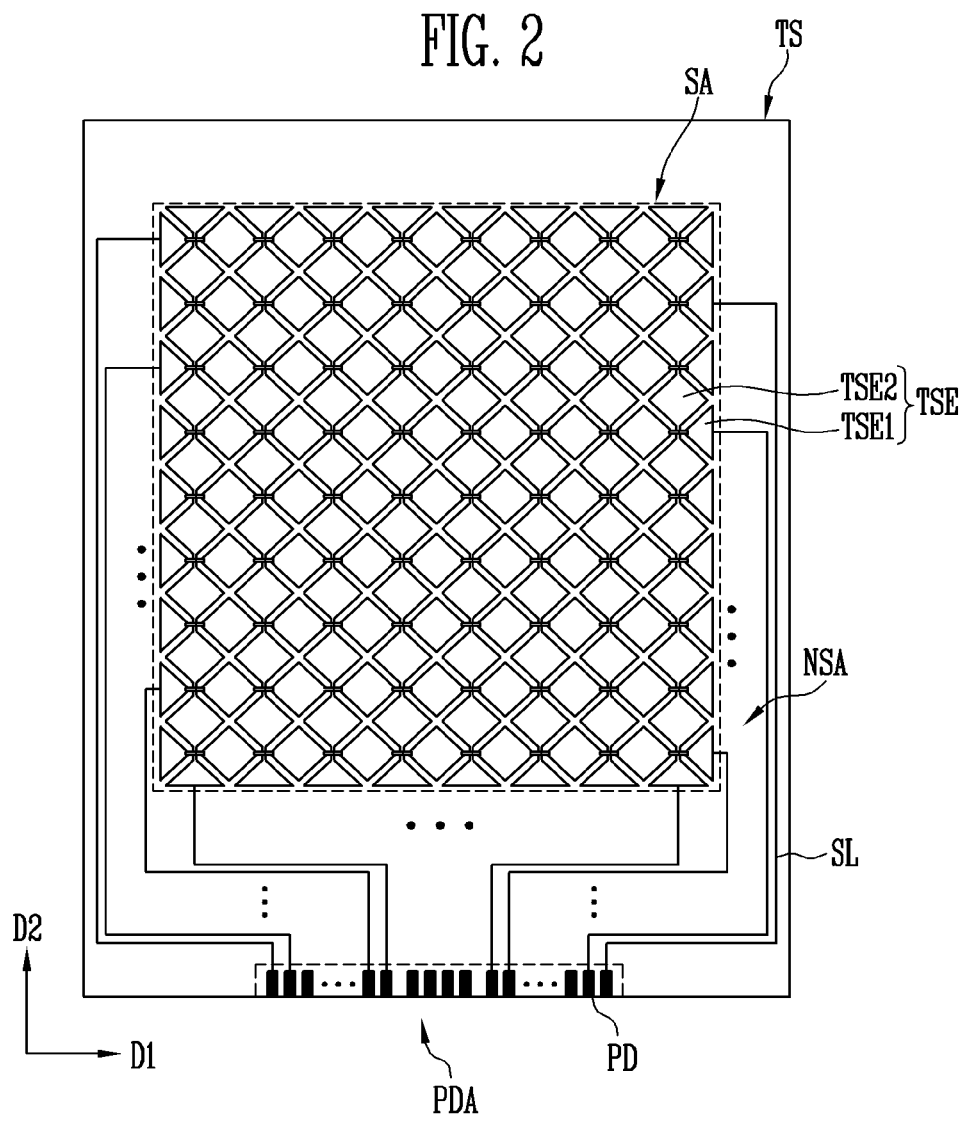
FIG. 2 is a plan view schematically illustrating the touch sensor shown in FIG. 1.
Figure 3:
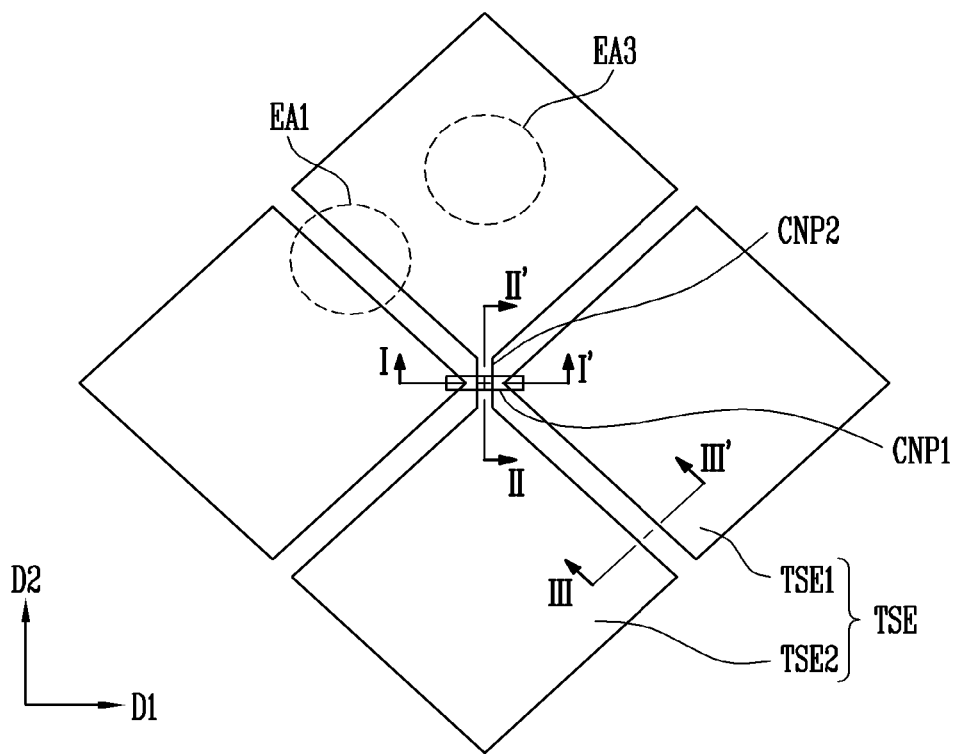
FIG. 3 is a partially enlarged view of the exemplary touch sensing electrodes of the touch sensor shown in FIG. 2.
Figure 4:
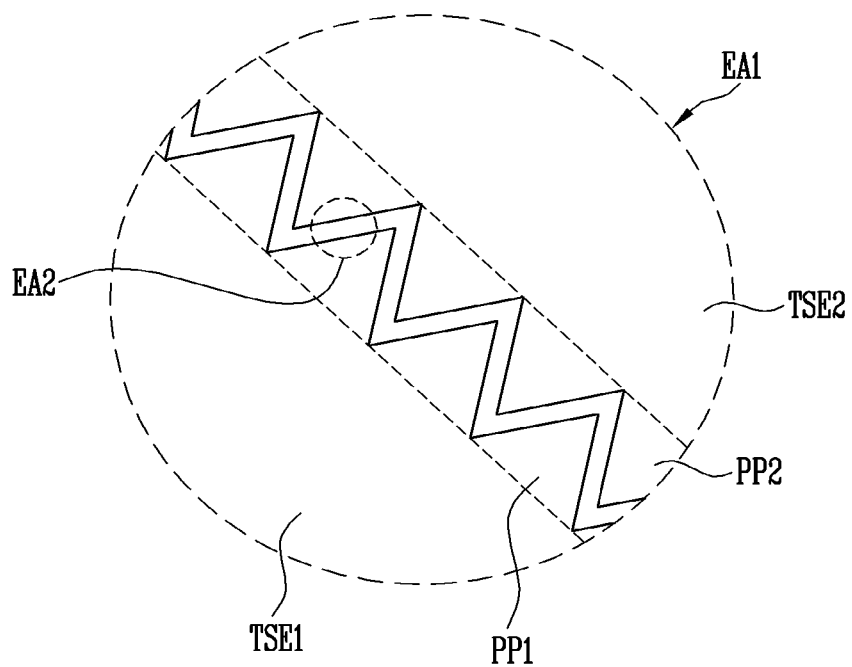
FIG. 4 is an enlarged view of EA1 in FIG. 3.
Figure 5:
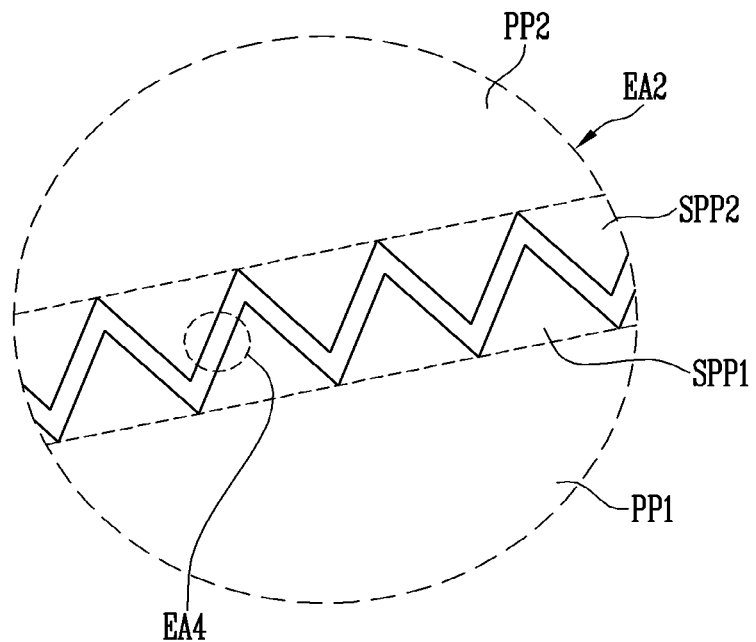
FIG. 5 is an enlarged view of EA2 in FIG. 4.
Figure 6:
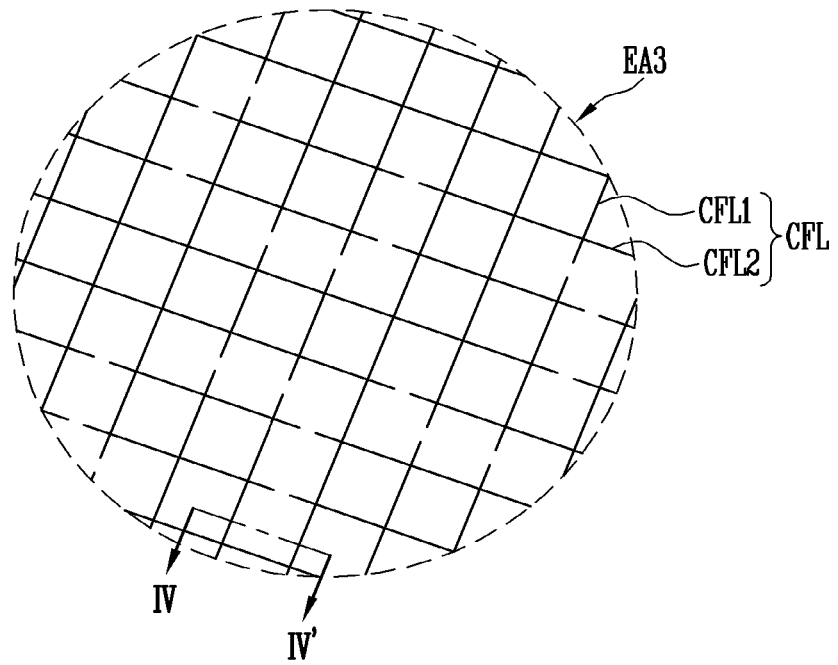
FIG. 6 is an enlarged view of EA3 in FIG. 3.
Figure 7:
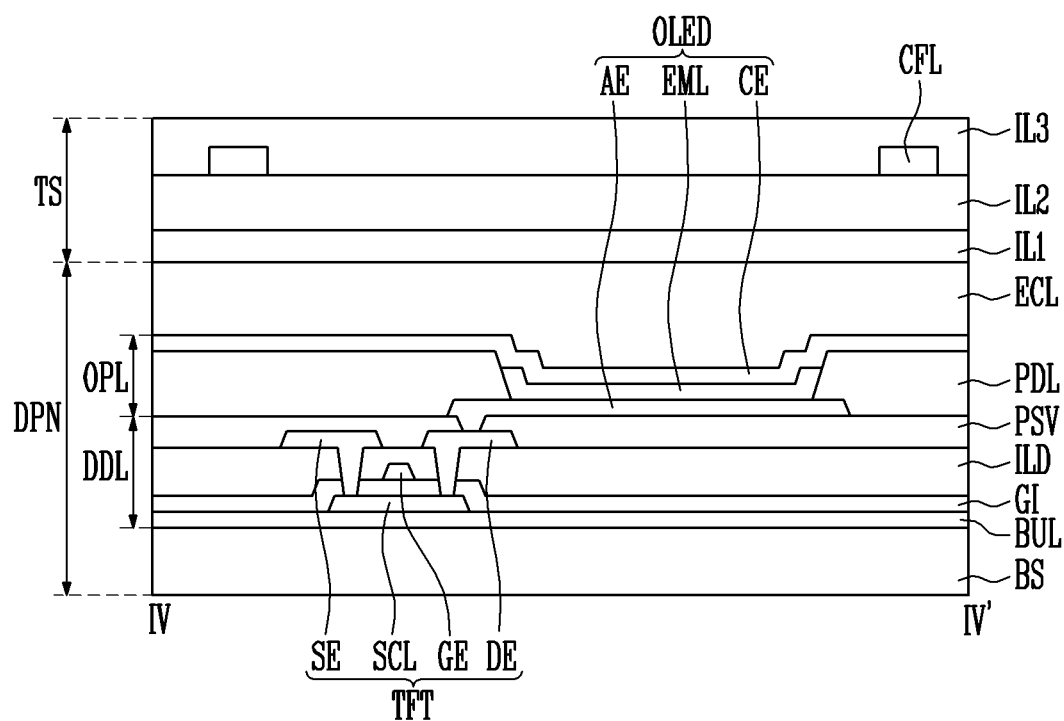
FIG. 7 is a cross-sectional view along line IV-IV' in FIG. 6.
Figure 8:
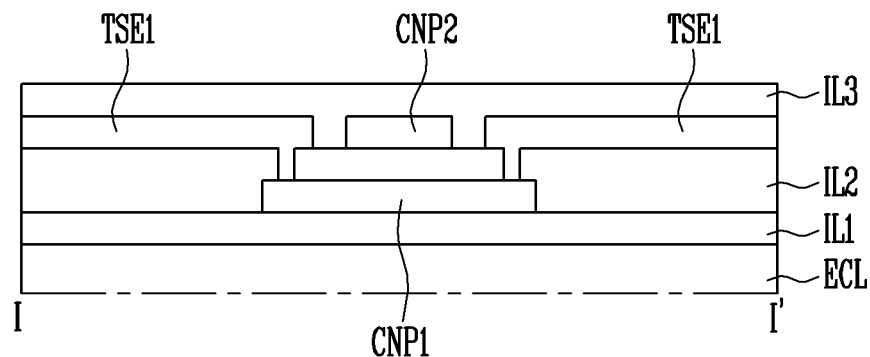
FIG. 8 is a cross-sectional view along line I-I line in FIG. 3.
Figure 9:
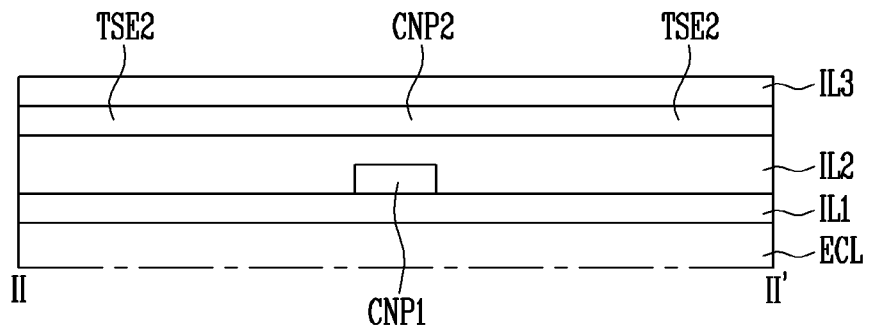
FIG. 9 is a cross-sectional view along line II-II' in FIG. 3.
Figure 10:
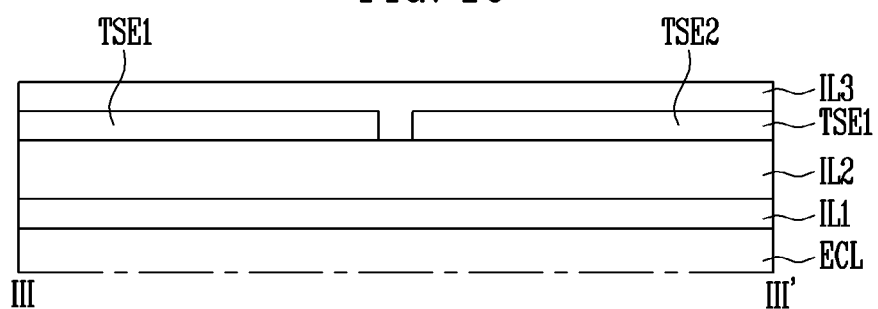
FIG. 10 is a cross-sectional view along line III-III' line in FIG. 3.

FIG. 1 is a perspective view of a display device including a touch sensor according to an exemplary embodiment. FIG. 2 is a plan view schematically illustrating the touch sensor shown in FIG. 1. FIG. 3 is a partially enlarged view of the exemplary touch sensing electrodes of the touch sensor shown in FIG. 2. FIG. 4 is an enlarged view of EA1 in FIG. 3. FIG. 5 is an enlarged view of EA2 in FIG. 4. FIG. 6 is an enlarged view of EA3 in FIG. 3. FIG. 7 is a cross-sectional view along line IV-IV' in FIG. 6. FIG. 8 is a cross-sectional view along line I-I line in FIG. 3. FIG. 9 is a cross-sectional view along line II-II' in FIG. 3. FIG. 10 is a cross-sectional view along line III-III' line in FIG. 3.

Referring to FIGS. 1 to 10, a display device may include a display panel DPN and a touch sensor TS.

The display panel DPN may show an image. The display panel DPN is not specifically limited. For example, the display panel DPN may be a display panel capable of spontaneous emission such as an organic light emitting display (OLED) panel. Also, the display panel (DPN) may use a nonradiative display panel such as a liquid crystal display (LCD) panel, an electro-phoretic display (EPD) panel, an electro-wetting display (EWD) panel, etc. If the display panel DPN uses a nonradiative display panel, the display device may include a back-light unit which supplies light to the display panel DPN. In this embodiment, the OLED panel is described as an example.

The display panel DPN may include a display area (not shown) and a non-display area (not shown). The display area may include plurality of pixels. The non-display area may be provided adjacent to the display area. For example, the non-display area may appear to surround the display area. Each pixel may be one of red, green, blue and white, but is not limited thereto. For example, the pixel may be one of magenta, cyan and yellow. The pixels may include an organic light emitting diode (OLED). The OLED may be an organic light emitting diode.

Referring also to FIG. 7, the display panel DPN may include a base substrate BS, a driving layer provided on the base substrate BS, an optical layer OPL provided on the driving layer DDL and a capping layer ECL provided on the optical layer OPL.

The base substrate BS may include a display area and a non-display area. Pixel areas where pixels are arranged may be provided in the display area. The non-display area may be arranged near the display area.

The base substrate BS may include a transparent insulative material and allow light to pass through. Furthermore, the base substrate BS may be a rigid substrate or a flexible substrate. The rigid substrate may be one of a glass substrate, a quartz substrate, a glass ceramic substrate and a crystalline glass substrate. The flexible substrate may include a film substrate or a plastic substrate which includes high molecular organic matter. For example, the flexible substrate may include one of polyethersulfone PES, polyacrylate, polyetherimide PEI, polyethylene naphthalate PEN, polyethylene terephthalate PET, polyphenylene sulfide PPS, polyarylate PAR, polyimide PI, polycarbonate PC, triacetate cellulose TAC and cellulose acetate propionate CAP. Also, the flexible substrate may include fiber glass reinforced plastic FRP.

The material for the base substrate BS may preferably have resistance to high temperature (or heat resisting property) at the time of manufacture of the display device.

The driving layer DDL may be provided on the base substrate BS and include at least one thin film transistor TFT provided in each pixel area. Also, the driving layer DDL may include a buffer layer BUL provided between the base substrate BS and the thin film transistor TFT. The buffer layer BUL may include an inorganic insulative material. For example, the buffer layer BUL may include at least one of silicon oxide, silicon nitride and silicon oxynitride. Also, the buffer layer BUL may have a single layer structure or a multi-layer structure. For example, the buffer layer BUL may have a single layer structure that includes one of a silicon oxide, silicon nitride and silicon oxynitride. The buffer layer BUL may include a silicon oxide film and a silicon nitride film provided on the silicon oxide film. The buffer layer BUL may include 3 or more sequentially stacked insulating layers.

The buffer layer BUL may prevent impurities from expanding into the thin film transistor TFT from the base substrate BS. Also, the buffer layer BUL may flatten or planarize the surface of the base substrate BS.

The thin film transistor TFT may be connected to a gate line (not shown) or a data line (not shown). The thin film transistor TFT may include a semiconductor layer SCL, a gate electrode GE, a source electrode SE and a drain electrode DE.

The semiconductor layer SCL may be arranged on the buffer layer BUL. The semiconductor layer SCL may include one of an amorphous silicon (Si), a poly crystalline Si, or an oxide semiconductor and an organic semiconductor. In the semiconductor layer SCL, the area that connects to the source electrode SE and the drain electrode DE may be a source area and a drain area where impurities are doped or injected into. The area between the source area and the drain area may be a channel area.

Although not shown in the drawings, if the semiconductor layer SCL includes an oxide semiconductor, a light blocking layer may be provided at the upper or lower part of the semiconductor layer SCL to block the light passing into the semiconductor layer SCL.

There may be a gate insulative layer GI on the semiconductor layer SCL. The gate insulative layer GI may cover the semiconductor layer SCL and may insulate the semiconductor layer SCL and the gate electrode GE. The gate insulative layer GI may include at least one of the organic insulative material or inorganic insulative material. For example, the gate insulative layer GI may include at least one of silicon oxide and silicon nitride.

The gate electrode GE may be provided on the gate insulative layer GI. The gate electrode GE may be connected to the gate line. The gate electrode GE may include a low resistance conductive material and may overlap the semiconductor layer SCL.

An interlayer insulative layer ILD may be provided between gate electrodes GE. The interlayer insulative layer ILD may include at least one of organic insulative material and inorganic insulative material. For example, the interlayer insulative layer ILD may include at least one of silicon oxide and silicon nitride. The interlayer insulative layer ILD may insulate the source electrode SE and the drain electrode DE, and the gate electrode GE.

Contact holes that pass through the gate insulative layer GI and the interlayer insulative layer ILD may expose the source area and the drain area of the semiconductor layer SCL.

The source electrode SE and the drain electrode DE may be arranged on the interlayer insulative layer ILD spaced apart from each other. The source electrode SE and the drain electrode DE may include a low resistance conductive material. One end of the source electrode SE may be connected to the data line. The other end of the source electrode SE may be connected to the source area through one of the contact holes. One end of the drain electrode DE may be connected to the drain area through another one of the contact holes. The other end of the drain electrode DE may be connected to the display device OLED.

While in an exemplary embodiment, the thin film transistor TFT is illustrated as a thin film transistor having a top gate structure, but it is not limited thererto. For example, the thin film transistor TFT may be a thin film transistor having a bottom gate structure as well.

The driving layer DDL may further include a protective layer PSV provided on the thin film transistor TFT. The protective layer PSV may cover the thin film transistor TFT. A portion of the protective layer PSV may be removed to expose one of the source electrode SE or the drain electrode DE.

The protective layer PSV may include at least one layer. For example, the protective layer PSV may include an inorganic protective layer and an organic protective layer arranged on the inorganic protective layer. The inorganic protective layer may include at least one of silicon oxide and silicon nitride. The organic protective layer may include one of acryl, polyimide PI, polyamide PA and benzocyclobutene BCB. Also, the organic protective layer may be transparent, flattened layer capable of flattening by relaxing the curvature of the lower structure since it is flexible.

The optical layer OPL may be provided on the protective layer PSV and include a display device OLED connected to the drain electrode DE.

The display device OLED may include a first electrode AE connected to the drain electrode DE, a light emitting layer EML provided on the first electrode AE and a second electrode CE provided on the light emitting layer EML.

One of the first electrode AE and the second electrode CE may be an anode, and the other may be a cathode. For example, the first electrode AE may be an anode and the second electrode CE may be a cathode.

At least one of the first electrode AE and the second electrode CE may be a penetrative electrode. For example, in the case of a bottom-emission organic light emitting device, the first electrode AE may be a penetrative electrode and the second electrode CE may be a reflective electrode. If the display device OLED is a top emission organic light emitting device, the first electrode may be a reflective electrode, and the second electrode may be a penetrative electrode. If the display device OLED is a both side emission organic light emitting device, the first electrode AE and the second electrode CE may both be penetrative electrodes. In an exemplary embodiment, the display device OLED is illustrated as a top emission organic light emitting device, and the first electrode AE is illustrated as an anode electrode, but it is not limited thereto.

In each pixel area, the first electrode AE may be provided on the protective layer PSV. The first electrode AE may include a reflective layer (not shown) capable of reflecting light and a transparent conductive layer (not shown) provided on or below the reflective layer. At least one of the transparent conductive layer and the reflective layer may be connected to the drain electrode DE.

The reflective layer may include a material capable of reflecting light. For example, the reflective layer may include aluminum (Al), silver (Ag), molybdenum (Mo), platinum (Pt), nickel (Ni) and at least one of the combination thereof.

The transparent conductive layer may include a transparent conductive oxide. For example, the transparent conductive layer may include at least one transparent conductive oxide of indium tin oxide (ITO), indium zinc oxide (IZO), aluminum zinc oxide (AZO), gallium doped zinc oxide (GZO), zinc tin oxide (ZTO), gallium tin oxide (GTO) and fluorine doped tin oxide (FTO).

A pixel defining layer PDL may be provided on the first electrode AE. The pixel defining layer PDL may be provided between pixel areas. The pixel defining layer PDL may expose the first electrode AE. The pixel defining layer PDL may overlap an edge portion of the first electrode AE. The pixel defining layer PDL may expose most of surface facing a second substrate of the first electrode AE.

The pixel defining layer PDL may include an organic insulative material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin and silane based resin.

The light emitting layer may be provided on the exposed surface of the first electrode AE. The light emitting layer EML may be a multi-stacked thin film structure including at least a light generation layer LGL. For example, the light emitting layer EML may include a hole injection layer HIL injecting holes, a hole transport layer HTL with superior transportation of holes and for enhancing an opportunity to recombine of holes with electrons by restricting transfer of electrons which have not been combined in the light generation layer, a light generation layer emitting light by recombining injected holes with holes, a hole blocking layer HBL for restricting transfer of holes which have not be combined in the light generation layer, and an electron transport layer ETL for smoothly transporting electrons to the light generation layer and an electron injection layer injecting electrons.

The color of the light generated in the light generation layer may be one of red, green, blue and white, but it is not limited thereto. For example, the color of the light generated in the light generation layer may be one of magenta, cyan and yellow.

The hole injection layer, the hole transport layer, the hole restriction layer, the electron transport layer and the electron injection layer may be a common layer where adjacent pixel areas are connected.

The second electrode CE may be provided on the light emitting layer EML. The second electrode CE may be a semipermeable reflective layer. For example, the second electrode CE may be a thin film metal layer having a thickness which may allow light to pass through. The second electrode CE may allow a portion of light generated in the light generation layer to pass through and a remaining portion of light generated in the light generation layer to be reflected.

The second electrode CE may include a material with a low work function compared to a transparent conductive layer. For example, the second electrode CE may include at least one of Mo, W, Ag, Mg, Al, Pt, Pd, Au, Ni, Nd, Ir, Cr, Li, Ca and at least one of an alloy thereof.

A portion of the light coming out from the light emitting layer may not pass through the second electrode CE, and the light reflected from the second electrode CE may be reflected again at the reflective layer. That is, the light that came out from the light emitting layer may resonate between the reflective layer and the second electrode CE. The light extraction efficiency of the display device OLED may be enhanced by the resonance of the light.

The distance between the reflective layer and the second electrode CE may vary depending on the color of the light generated in the light generation layer. That is, depending on the color of the light generated in the light generation layer, the distance between the reflective layer and the second electrode CE may be adjusted to conform to the distance of the resonance.

A capping layer ECL may be provided on the second electrode CE. The capping layer ECL may prevent oxygen or moisture from penetrating into the display device OLED by covering the display device OLED. The capping layer ECL may include a plurality of insulating layers. For example, the capping layer ECL may include a plurality of inorganic layers (not shown) and a plurality of organic layers (not shown). Also, the capping layer ECL may include a plurality of encapsulating units that include an inorganic layer and an organic layer provided on the inorganic layer. The inorganic layer may include at least one of silicon oxide, silicon nitride, silicon oxynitride, aluminum oxide, titanium oxide, zirconium oxideand and an oxide of tin. The organic layer may include one of acryl, polyimide (PI), polyamide (PA) and benzocyclobutene (BCB).

A touch sensor TS may be provided on one surface of a display panel DPN. For example, the touch sensor TS may be provided on the capping layer ECL. The touch sensor TS may include a sensing area SA capable of detecting a touch position of a user and a non-sensing area NSA provided near the sensing area SA. The sensing area SA may correspond to a display area of the display panel DPN. The non-sensing area NSA may correspond to a non-display area of the display panel DPN.

Referring to FIG. 2, the touch sensor TS may include a plurality of sensing electrodes TSE provided to the sensing area SA and sensing lines SL connecting the sensing electrodes TSE to a pad part PDA in the non-sensing area NSA. Each of the sensing lines SL may be connected to a pad PD of the pad part PDA.

Referring to FIG. 3, the touch sensor TS may be a mutual capacitance touch sensor. The touch sensor TS may detect a touch position of a user by detecting a change in capacitance of the capacitor formed between adjacent sensing electrodes TSE. A portion of the sensing electrodes TSE may be arranged in a first direction D1 and electrically connected to each other, thereby forming a plurality of sensing rows that are parallel to each other. Here, the sensing electrodes TSE included in the sensing rows may be first sensing electrodes TSE1. In sensing rows, the first sensing electrodes TSE1 adjacent to each other may be electrically connected through a first connection pattern CNP1. Also, the rest of the sensing electrodes TSE may be arranged in a second direction D2 crossing the first direction D1 and electrically connected, forming a plurality of sensing columns that are parallel to each other. Here, the sensing electrodes TSE included in the sensing columns may be second sensing electrodes TSE2. In sensing columns, the second sensing electrodes TSE2 that are adjacent to each other, they may be electrically connected through the second connection pattern CNP2. Each of the sensing columns and the sensing rows may be electrically connected to the pads PD through the sensing lines SL.

One of the first sensing electrodes TSE1 and the second sensing electrodes TSE2 may receive a driving signal for sensing a touch through a portion of sensing lines, and the other of the first sensing electrodes TSE1 and the second sensing electrodes TSE2 may transfer a touch sense signal through the rest of the sensing lines SL. For example, the second sensing electrodes TSE2 may receive a touch driving signal, and the first sensing electrodes TSE1 may transfer a touch sense signal.

Also, an area of the first sensing electrodes TSE1 and an area of the second sensing electrodes TSE2 may be different from each other. For example, the area of the second sensing electrodes TSE2 may be smaller than the area of the first sensing electrodes TSE1.

The touch sensor TS may include a first insulating layer ILL a first conductive layer provided on the first insulating layer ILL a second insulating layer IL2 covering the first conductive layer, a second conductive layer provided on the second insulating layer IL2 and a third insulating layer IL3 covering the second conductive layer.

The first insulating layer IL1 may be provided on the capping layer ECL. The first insulating layer IL1 may include at least one of the organic insulative material and the inorganic insulative material. For example, the first insulating layer IL1 may include at least one of silicon oxide, silicon nitride and silicon oxynitride.

In an exemplary embodiment, the first conductive layer is illustrated as being provided on the first insulating layer ILL but it is not limited thereto. For example, if an uppermost layer of the capping layer ECL includes an inorganic insulative material, the first insulating layer IL1 may be omitted and the first conductive layer may be provided on the capping layer ECL.

The first conductive layer may include at least one of the first sensing electrodes TSE1, the second sensing electrodes TSE2, the first connection pattern CNP1 and the second connection pattern CNP2. For example, the first conductive layer CNP1 may include the second connection pattern CNP2. Also, the first conductive layer may include a conductive material. Here, the conductive material layer may include a transparent conductive oxide, or a metal material.

The first conductive layer may include a plurality of stacked metal layers. For example, the first conductive layer may include a first metal layer provided on the first insulating layer IL1, a second metal layer provided on the first metal layer and a third metal layer provided on the second metal layer.

The second insulating layer IL2 may be provided on the first insulating layer IL1 and the first conductive layer. The second insulating layer IL2 may include the same material as the first insulating layer IL1. For example, the second insulating layer IL2 may include at least one of silicon oxide, silicon nitride and silicon oxynitride.

The second conductive layer may include one conductive material layer such as the first conductive layer or include a plurality of stacked conductive material layers. The second conductive layer may include at least one of first sensing electrodes TSE1, second sensing electrodes TSE2, a first connection pattern CNP1 and a second connection pattern CNP2. For example, the second conductive layer may include first sensing electrodes TSE1, second sensing electrodes TSE2 and a second connection pattern CNP2.

The third insulating layer IL3 may be provided on the second insulating layer IL2 and the second conductive layer. The third insulating layer IL3 may prevent the second conductive layer from being corroded by preventing the second conductive layer from being exposed to outside.

The third insulating layer IL3 may include an organic insulative material. For example, the third insulating layer IL3 may include one of acryl, polyimide (PI), polyamide (PA) and benzocyclobutene (BCB). Also, the third insulating layer IL3 may be transparent, and since it is flexible, it may be flattened by easing the curvature of the lower structure.

In an exemplary embodiment, the first connection pattern CNP1 is illustrated as being included in the first conductive layer and the second connection pattern CNP2 is illustrated as being included in the second conductive layer, but they are not limited thereto. For example, the second connection pattern CNP2 may be included in the first conductive layer, and the first connection pattern CNP1 may be included in the second conductive layer.

Also, in the exemplary embodiment, the first conductive layer is illustrated as being provided on the first insulating layer ILL and the second conductive layer is illustrated as being provided on the second insulating layer IL2, but they are not limited thereto. For example, the first conductive layer may be provided on the second insulating layer IL2, and the second conductive layer may be provided on the first insulating layer IL1.

Also, in the exemplary embodiment, the first sensing electrodes TSE1 and the second sensing electrodes TSE2 are illustrated as being provided on the same level, but they are not limited thereto. For example, the first sensing electrodes TSE1 and the second sensing electrodes TSE2 may be provided on different layers.

Among the first sensing electrodes TSE1, the second sensing electrodes TSE2, the first connection pattern CNP1 and the second connection pattern CNP2, at least the first sensing electrodes TSE1 and the second sensing electrodes TSE2 may include a plurality of conductive fine lines CFL that cross each other. For example, as illustrated in FIG. 6, the conductive fine lines CFL may include a plurality of first conductive fine lines CFL1 extending in a first direction and a plurality of second conductive fine lines CFL2 extending in a direction that crosses the first conductive fine lines CFL1.

The conductive fine lines CFL may be provided between adjacent pixel areas. For example, the conductive fine lines CFL may not overlap the display device OLED. In other words, the conductive fine lines CFL may be provided in an area excluding the area where the light comes out from the display device OLED.

The conductive fine lines CFL may be electrically connected to each other. The conductive fine lines CFL may have a shape where a portion of the conductive fine lines CFL is open, as shown in FIG. 6. The conductive fine lines CFL where they are open may be regularly arranged or randomly arranged. Also, the fine conductive lines CFL where they are open may be arranged in edge areas of the first sensing electrodes TSE1 and in edge areas of the second sensing electrodes TSE2. As a portion of the conductive fine lines CFL is opened, the edges of the first sensing electrodes TSE1 and the second sensing electrodes TSE2 may be prevented from being visible by the reflection of the external light.

As shown in FIG. 4, one of the adjacent first sensing electrode TSE1 and second sensing electrode TSE2 may include a plurality of first protrusions PP1 protruding from one edge toward another. Also, the other one of the adjacent first sensing electrode TSE1 and second sensing electrode TSE2 may include a plurality of second protrusions PP2 protruding from the another edge toward the one edge. For example, the first sensing electrode TSE1 may include first protrusions PP1, and the second sensing electrode TSE2 may include second protrusions PP2. The first protrusions PP1 may protrude toward the second sensing electrode TSE2 from an edge of the first sensing electrode TSE1, and the second protrusions PP2 may protrude from an edge of the second sensing electrode TSE2 toward the first sensing electrode TSE1. The first protrusions PP1 and the second protrusions PP2 may be alternately arranged.

In the first sensing electrodes TSE1, a pitch of the first protrusions PP1 may be ⅙ or less in length of an edge of the first sensing electrode TSE1. For example, the number of the first protrusions PP1 provided at one side of the first sensing electrodes TSE1 may be 6 or more. Also, the pitch of the first protrusions may be 5 mm or less.

Also, in the second sensing electrodes TSE2, a pitch of the second protrusions PP2 may be ⅙ or less in length of an edge of the second sensing electrode TSE2. For example, the number of the second protrusions PP2 provided at one side of the second sensing electrodes TSE2 may be 6 or more. Also, the pitch of the second protrusions may be 5 mm or less.

Referring to FIG. 5, first sub protrusions SPP1 protruding toward the second protrusions PP2 may be provided at an edge of the first protrusions PP1. Second sub protrusions SPP2 protruding toward the first protrusions PP1 may be provided at an edge of the second protrusions PP2. The first sub protrusions SPP1 and the second sub protrusions SPP2 may be alternately arranged.

As described above, when the first sensing electrodes TSE1 and the second sensing electrodes TSE2 may include first protrusions PP1 and second protrusions PP2 and the first sub protrusions SPP1 and the second sub protrusions SPP2 are provided at edges of the first protrusions PP1 and second protrusions PP2, the length of the line between the adjacent first sensing electrode TSE1 and the second sensing electrode TSE2 that faces each other may increase. If the length of the line between the adjacent first sensing electrode TSE1 and second sensing electrode TSE2 that faces each other increases, a mutual capacitance Cm of the capacitor formed between the adjacent first sensing electrode TSE1 and the second sensing electrode TSE2 may increase. Also, the amount of change (ΔCm) of the capacitance according to the touch of the user may also increase. Accordingly, touch sensitivity of the touch sensor TS may be enhanced.

Figure 11:
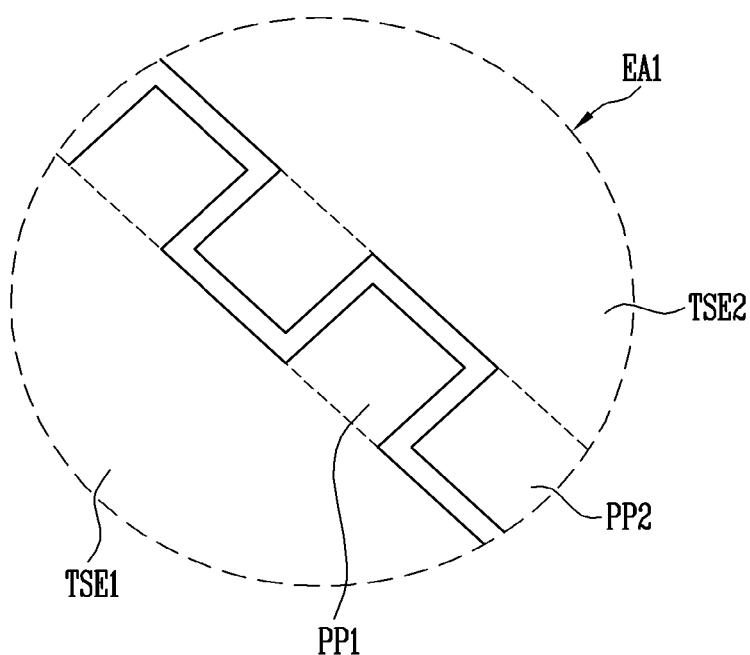
FIGS. 11, 12, and 13 illustrate the shape of the protrusions between adjacent touch sensing electrodes.
Figure 12:
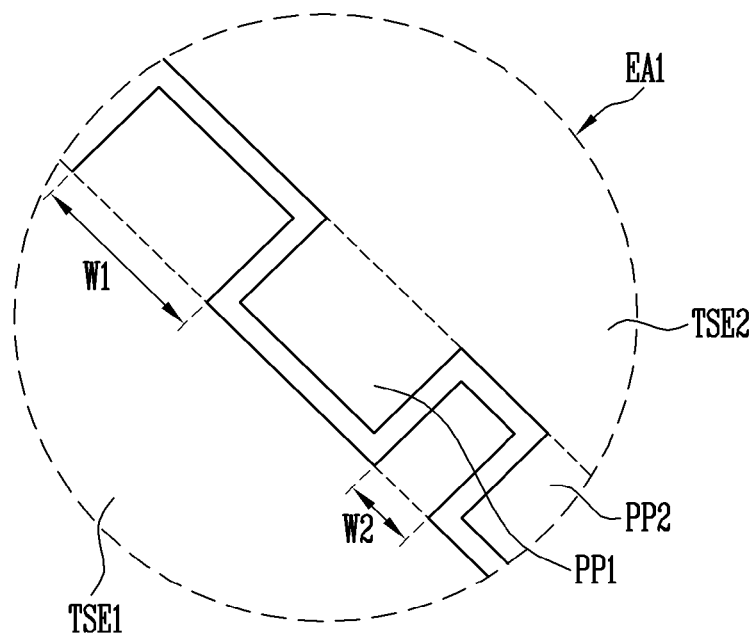
Figure 13:
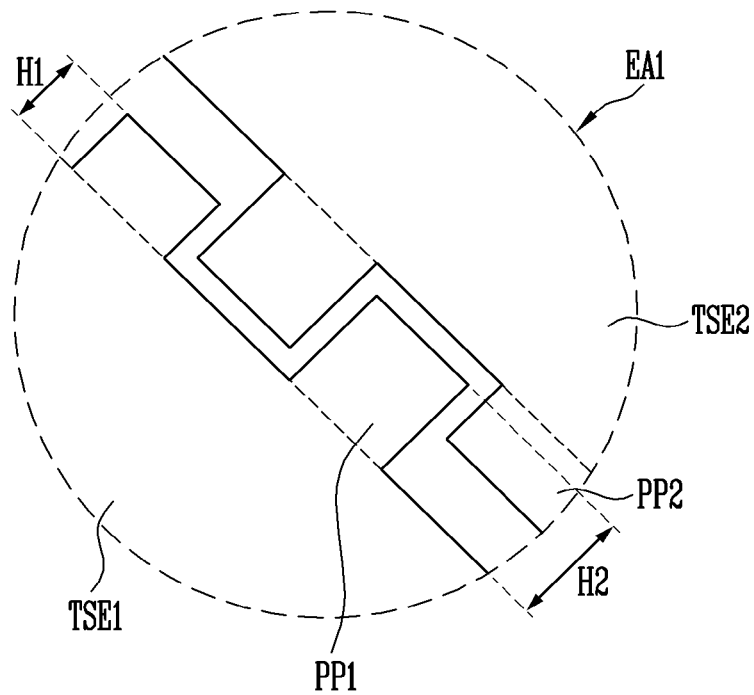

FIGS. 11 to 13 illustrate the shape of the protrusions between adjacent touch sensing electrodes. FIGS. 11 to 13 are enlarged views of EA1 in FIG. 3.

Referring to FIGS. 4 and 11 to 13, the first protrusions PP1 and the second protrusions PP2 may have a shape where the first protrusions PP1 and the second protrusions PP2 protrude from edges of the first sensing electrodes TSE1 and the second sensing electrodes TSE2.

The first protrusions PP1 and the second protrusions PP2 may have a closed curve shape with a straight side. Here, one side of the first protrusions PP1 and the second protrusions PP2 may be shared with an edge of the first sensing electrodes TSE1 and the second sensing electrodes TSE2.

Hereinafter the shapes of the first protrusions PP1 and the second protrusions PP2 are described more in detail.

As shown in FIG. 4, the first protrusions PP1 and the second protrusions PP2 may protrude from edges of the first sensing electrodes TSE1 and the second sensing electrodes TSE2. The first protrusions PP1 and the second protrusions PP2 may have triangular shapes.

Also, as shown in FIGS. 11 to 13, the first protrusion PP1 and the second protrusions PP2 may protrude from edges of the first sensing electrodes TSE1 and the second sensing electrodes TSE2. The first protrusions PP1 and the second protrusions PP2 may have square shapes.

As shown in FIG. 11, the first protrusions PP1 in a direction parallel to the edges of the first sensing electrodes TSE1 may have same widths. The first protrusions PP1 and the second protrusions PP2 in a direction parallel to edges of the first sensing electrodes TSE1 and the second sensing electrodes TSE2 may have same widths.

Also, in a direction perpendicular to the edges of the first sensing electrodes TSE1, the first protrusions PP1 have same heights. In a direction perpendicular to the edges of the second sensing electrodes TSE2, the second protrusions may have same heights.

As shown in FIG. 12, the first protrusions PP1 in a direction parallel to the edges of the first sensing electrodes TSE1 may have different widths W1 and W2. For example, the width W1 of the first protrusions PP1 may be greater than the width W2 of the first protrusions PP1. Also, the first protrusions PP1 in a direction perpendicular to the edges of the first sensing electrodes TSE1 may have same heights.

The second protrusions PP2 in a direction parallel to the edges of the second sensing electrodes TSE2 may have different widths. Also, the second protrusions PP2 in a direction perpendicular to the edges of the second sensing electrodes TSE2 may have same heights.

As shown in FIG. 13, the first protrusions PP1 in a direction perpendicular to the edges of the first sensing electrodes TSE1 may have different heights H1 and H2. For example, one of the first protrusions PP1 may have a height H1 that is greater than a height H2 of another one of the first protrusions PP1. Also, the first protrusions PP1 in a direction parallel to the edges of the first sensing electrodes TSE1 may have same widths.

Also, the second protrusions PP2 in a direction perpendicular to the edges of the second sensing electrodes TSE2 may have different heights. Also, the second protrusions PP2 in a direction parallel to the edges of the second sensing electrodes TSE2 may have same widths.

Figure 14:
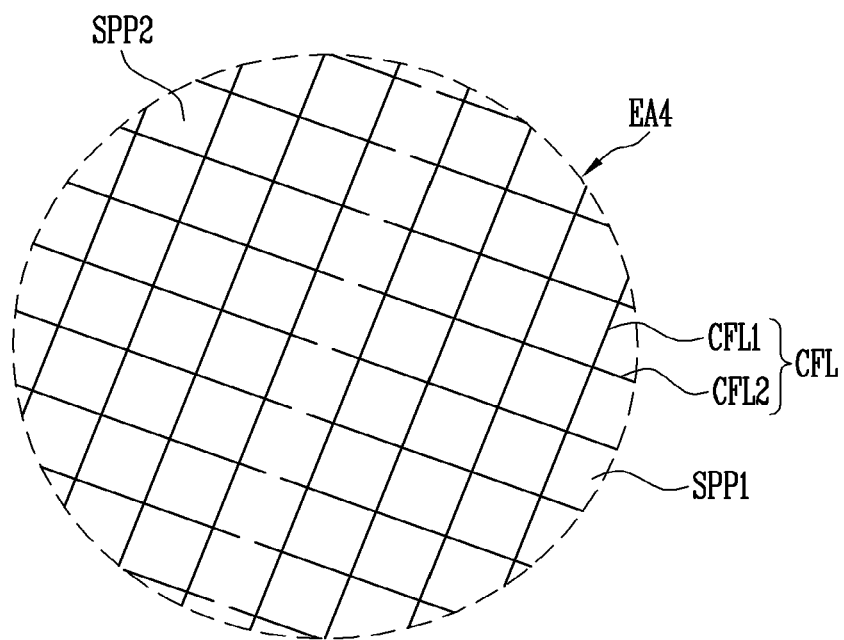
FIGS. 14 and 15 illustrate the shape between adjacent sub protrusions.
Figure 15:
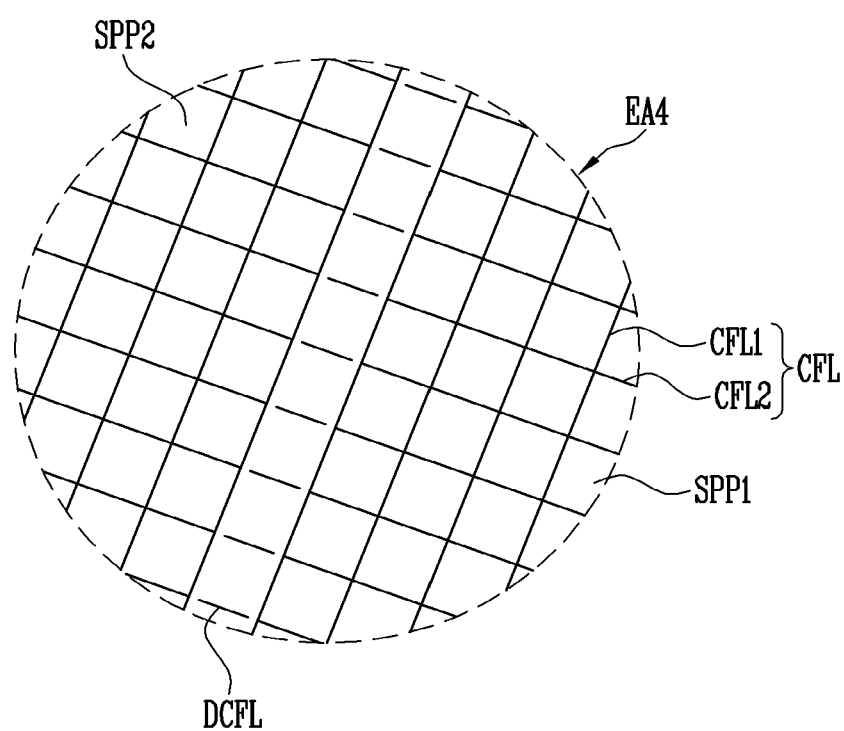

FIGS. 14 and 15 illustrate the shape between adjacent sub protrusions. FIGS. 14 and 15 are enlarged views of EA4 in FIG. 5.

Referring to FIGS. 14 and 15, the first sub protrusions SPP1 and the second sub protrusions SPP2 may include a plurality of conductive fine lines CFL. The conductive fine lines CFL may include first conductive fine lines CFL1 extending in one direction and second conductive fine lines CFL2 extending in a direction crossing the first conductive fine lines CFL1.

The first sub protrusions SPP1 and the second sub protrusions SPP2 that are adjacent to each other may be spaced apart at regular intervals.

Hereinafter the shape of the first sub protrusions SPP1 and the second sub protrusions SPP2 adjacent to each other being spaced apart is described.

As shown in FIG. 14, the first sub protrusions SPP1 and the second sub protrusions SPP2 adjacent to each other may be spaced apart in a shape in which the conductive fine lines CFL between two conductive fine lines CFL that are adjacent and parallel to each other are cut off along one dotted line. The dotted line may divide the conductive fine lines CFL into conductive fine lines CFL of the first sub protrusion SPP1 and the conductive fine lines CFL of the second sub protrusion SPP2.

The dotted line may be provided between adjacent first conductive fine lines CFL1, or adjacent second conductive fine lines CFL2. For example, the dotted line may be provided between adjacent first conductive fine lines CFL1.

The second conductive fine lines CFL2 of the first sub protrusions SPP1 and the second sub protrusions SPP2 may have a protrusion shape between the first conductive fine lines CFL1 on both sides of the dotted line.

Also, as shown in FIG. 15, dummy conductive fine lines DCFL may be provided between the first sub protrusions SPP1 and the second sub protrusions SPP2 that are adjacent to each other.

The dummy conductive fine lines DCFL may be provided between the first conductive fine line CFL1 of the first sub protrusions SPP1 and the first conductive fine line CFL1 of the second sub protrusion SPP2 that are adjacent and parallel to each other. Also, the dummy conductive fine lines DCFL may be parallel to the second conductive fine line CFL2 of the first sub protrusion SPP1 and the second conductive fine lines CFL2 that cross the first conductive fine line CFL1 of the second sub protrusion SPP2. Herein, the second conductive fine line CFL2 of the first sub protrusion SPP1 and the second conductive fine lines CFL2 of the second sub protrusion SPP2 being adjacent and parallel to each other.

Figure 16:
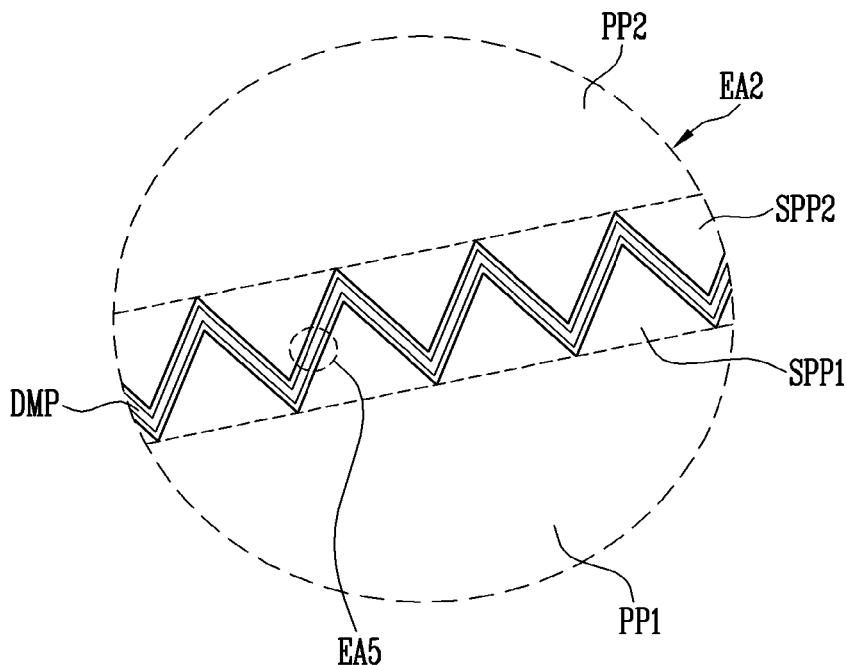
FIGS. 16, 17, and 18 illustrate the dummy portion between adjacent sub protrusions.
Figure 17:
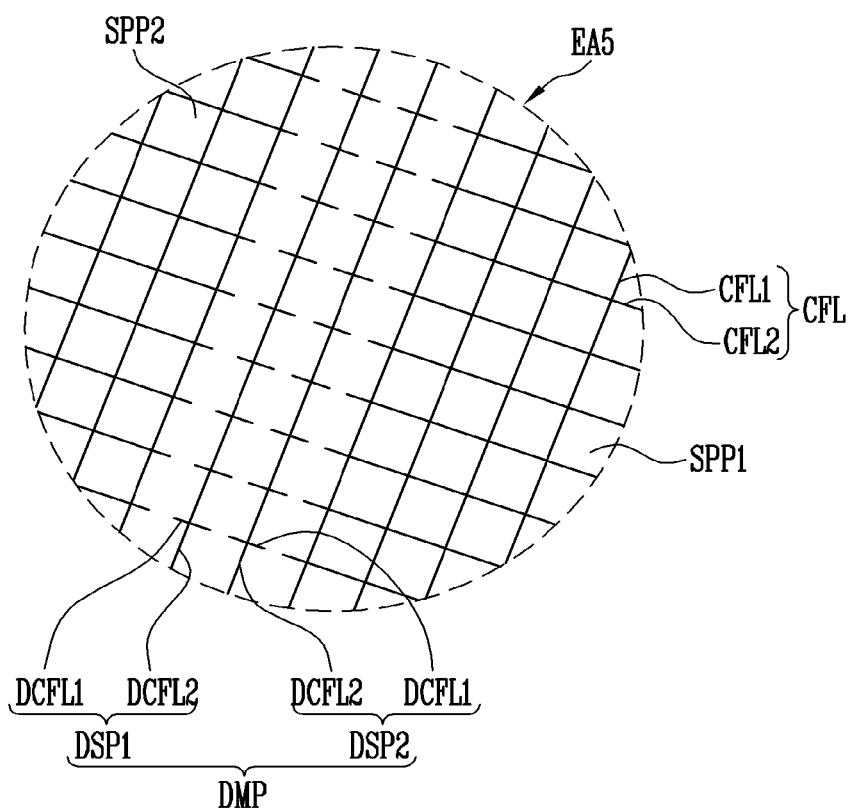
Figure 18:
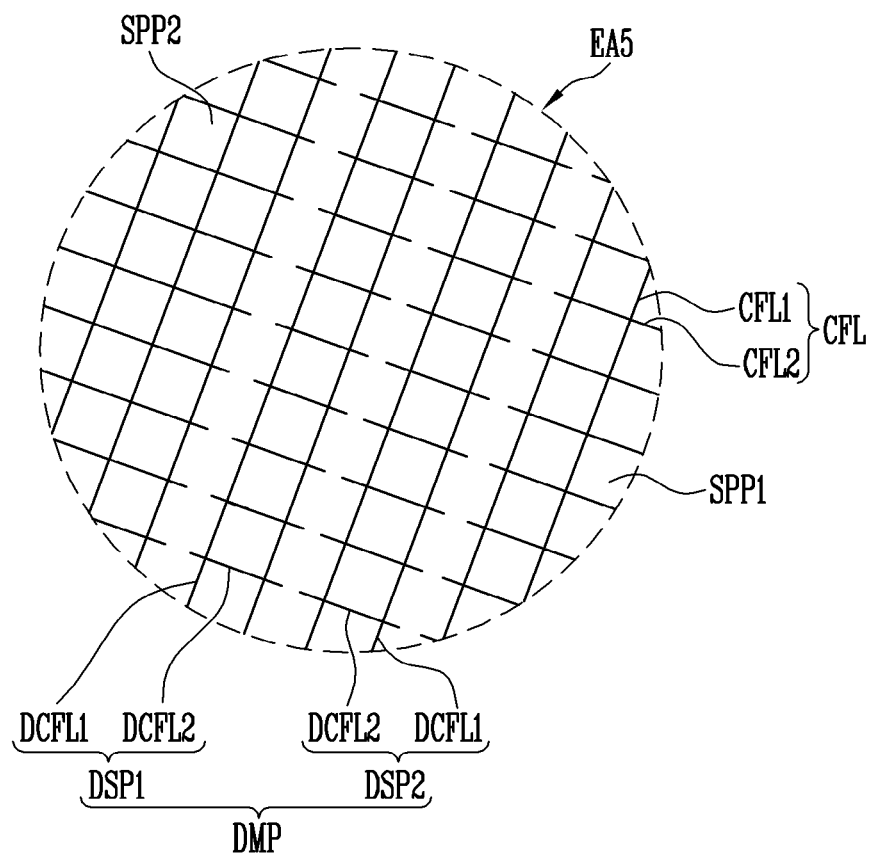

FIGS. 16 to 18 illustrate the dummy portion between adjacent sub protrusions. FIG. 16 is an enlarged view of EA2 in FIG. 4. FIGS. 17 and 18 are enlarged views of EA5 in FIG. 16.

Referring to FIGS. 16 to 18, the first sub protrusions SPP1 and the second sub protrusions SPP2 may include a plurality of conductive fine lines CFL. The conductive fine lines CFL may include the first conductive fine lines CFL1 extending in one direction and the second conductive fine lines CFL2 extending in a direction that crosses the first conductive fine lines CFL1. The conductive fine lines CFL may be provided between adjacent pixel areas. For example, in an area that is formed by the first conductive fine lines CFL1 and the second conductive fine lines CFL2 crossing each other, a display device (refer to OLED in FIG. 7) may be provided.

The first sub protrusions SPP1 and the second sub protrusions SPP2 that are adjacent to each other may be spaced apart from each other at regular intervals.

A dummy portion DMP that includes at least one dummy pattern DSP1 and DSP2 may be provided between the adjacent first sub protrusion SPP1 and second sub protrusion SPP2. For example, the dummy portion DMP may include a first dummy pattern DSP1 and a second dummy pattern DSP2.

The first dummy pattern DSP1 and the second dummy pattern DSP2 may have various shapes. For example, as shown in FIG. 17, each of the first dummy pattern DSP1 and the second dummy pattern DSP2 may have one first dummy conductive fine line DCFL1 and a plurality of second dummy conductive fine lines DCFL2 crossing the first dummy conductive fine line DCFL1. Also, as shown in FIG. 18, each of the first dummy pattern DSP1 and the second dummy pattern DSP2 may include two parallel first dummy conductive fine lines DCFL1 and a plurality of second dummy conductive fine lines DCFL2 crossing the first dummy conductive fine lines DCFL1. Here, the first dummy conductive fine lines DCFL1 may be parallel to the first conductive fine lines CFL1, and the second dummy conductive fine lines DCFL2 may be parallel to the second conductive fine lines CFL2. One pixel may be provided in an area that is formed by the first dummy conductive fine lines DCFL1 and the second dummy conductive fine lines DCFL2 crossing each other.

The distance between adjacent first sub protrusion SPP1 and second sub protrusion SPP2 may be defined by the shape of dummy patterns DSP1 and DSP2. For example, if the first dummy pattern DSP1 and the second dummy pattern DSP2 have the shape as shown in FIG. 1, approximately two pixel areas may be provided between adjacent first sub protrusion SPP1 and second sub protrusion SPP2. The distance between the adjacent first sub protrusion SPP1 and second sub protrusion SPP2 may correspond to the widths of approximately two pixel areas.

Also, if the first dummy pattern DSP1 and the second dummy pattern DSP2 have the shape as shown in FIG. 18, approximately four pixel areas may be provided between adjacent first sub protrusion SPP1 and second sub protrusion SPP2. The distance between the adjacent first sub protrusion SPP1 and second sub protrusion SPP2 may correspond to the widths of approximately four pixel areas.

Figure 19:
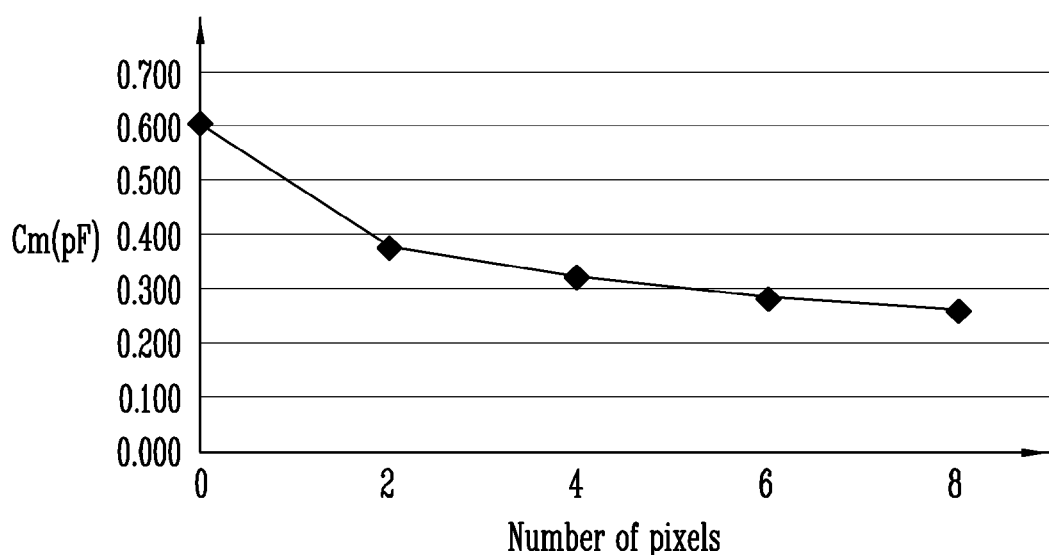
FIGS. 19, 20, and 21 are graphs illustrating capacitance according to the distance between adjacent first sensing electrode and second sensing electrode, the amount of change in the capacitance, and the ratio of the amount of change between capacitance and capacitance.
Figure 20:
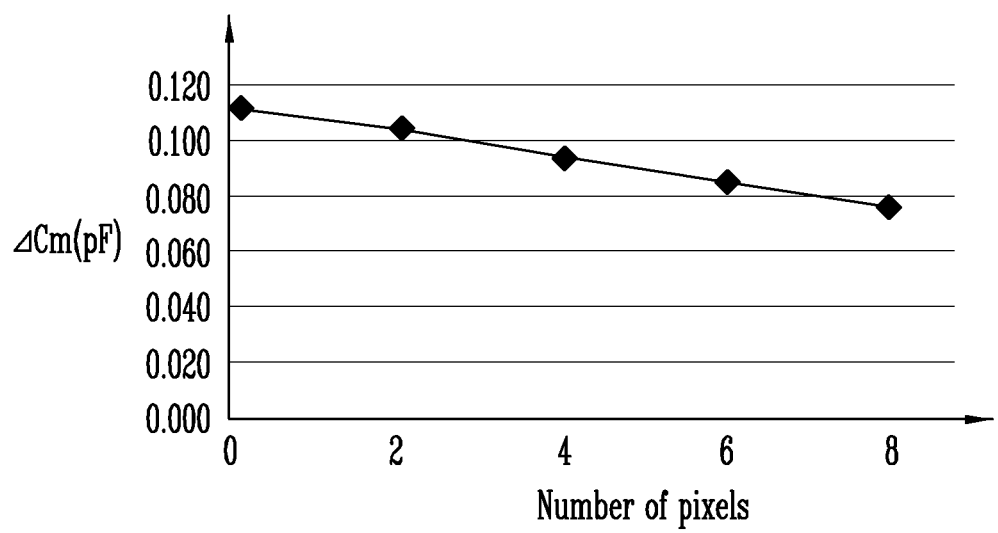
Figure 21:
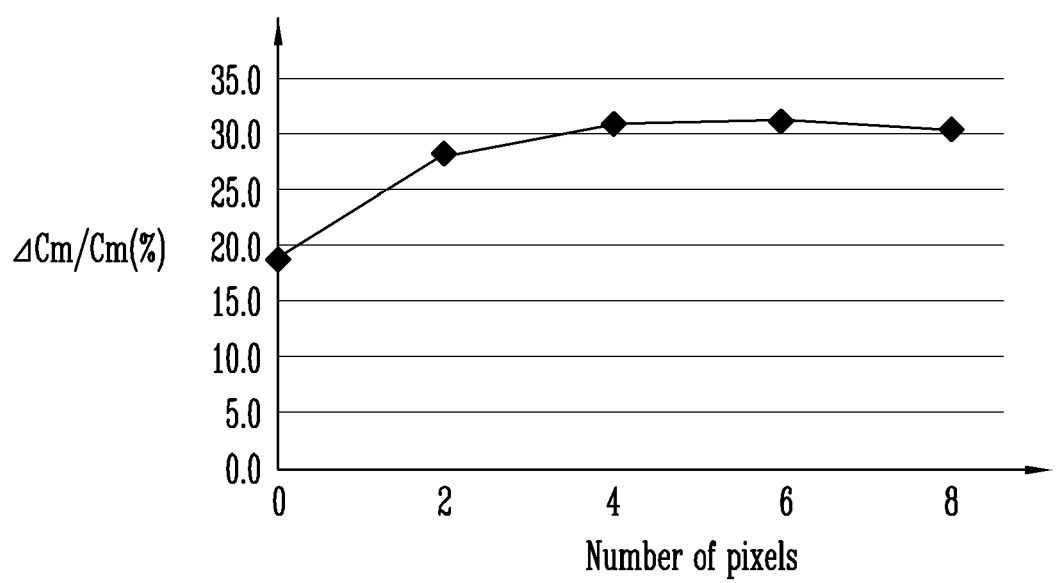

Referring to FIGS. 19 to 21, the capacitance according to the distance between the adjacent first sensing electrode and second sensing electrode, the amount of change of the capacitance, and the ratio of capacitance according to the capacitance will be described hereinafter. Here, the capacitance refers to a capacitance of the capacitor formed between the adjacent first sensing electrode and second sensing electrode, and the amount of change in capacitance refers to the amount of change in capacitance according to a user's touch.

FIG. 19 illustrates the capacitance according to the distance between the adjacent first sensing electrode and second sensing electrode. FIG. 20 illustrates the amount of change in capacitance according to the distance between the adjacent first sensing electrode and the second sensing electrode. FIG. 21 illustrate the capacitance according to the distance between the adjacent first sensing electrode and second sensing electrode and the ratio of the amount of change in capacitance.

In FIGS. 19 to 21, the distance between the adjacent first sensing electrode and second sensing electrode is expressed as a number of pixels. Here, the width of one pixel may be approximately 31 μm.

Referring to FIGS. 19 to 21, in the touch sensor (refer to TS in FIGS. 1 and 2), if the distance between the adjacent first sensing electrode (refer to TSE1 in FIGS. 2 and 3) and second sensing electrode (refer to TSE2 in FIGS. 2 and 3) is reduced, the capacitance Cm of the capacitor formed between the adjacent first sensing electrode TSE1 and second sensing electrode TSE2 may be reduced. Particularly, as shown in FIG. 19, the distance between the adjacent first sensing electrode TSE1 and second sensing electrode TSE2 and the capacitance of the capacitor formed between the adjacent first sensing electrode TSE1 and second sensing electrode TSE2 may be in inverse proportion.

Also, in the touch sensor TS, if the distance between the adjacent first sensing electrode TSE1 and second sensing electrode TSE2 is reduced, the amount ΔCm of change of the capacitance according to a user's touch may also decrease. However, unlike the distance between the adjacent first sensing electrode TSE1 and second sensing electrode TSE2 being in inverse proportion with the capacitance of the capacitor formed between the adjacent first sensing electrode TSE1 and second sensing electrode TSE2, as shown in FIG. 20, as the distance between the adjacent first sensing electrode TSE1 and second sensing electrode TSE2 increases, the amount of change ΔCm of the capacitance may be linearly reduced.

Meanwhile, as shown in FIG. 21, according to the distance between the adjacent first sensing electrode TSE1 and second sensing electrode TSE2, the ratio of the amount of change in capacitance with respect to the capacitance of the capacitor formed between the adjacent first sensing electrode TSE1 and second sensing electrode TSE2 may change.

Also, if the distance between the adjacent first sensing electrode TSE1 and second sensing electrode TSE2 is the widths of four pixel areas or greater, the change in the ratio of the amount of change in capacitance with respect to the capacitance of the capacitor according to the distance between the adjacent first sensing electrode TSE1 and second sensing electrode TSE2 may be very small. For example, if the distance between the adjacent first sensing electrode TSE1 and second sensing electrode TSE2 is the widths of four pixel areas or greater, the ratio of the amount of change in capacitance with respect to the capacitance of the capacitor according to the distance between the adjacent first sensing electrode TSE1 and second sensing electrode TSE2 may be constant.

Figure 22:
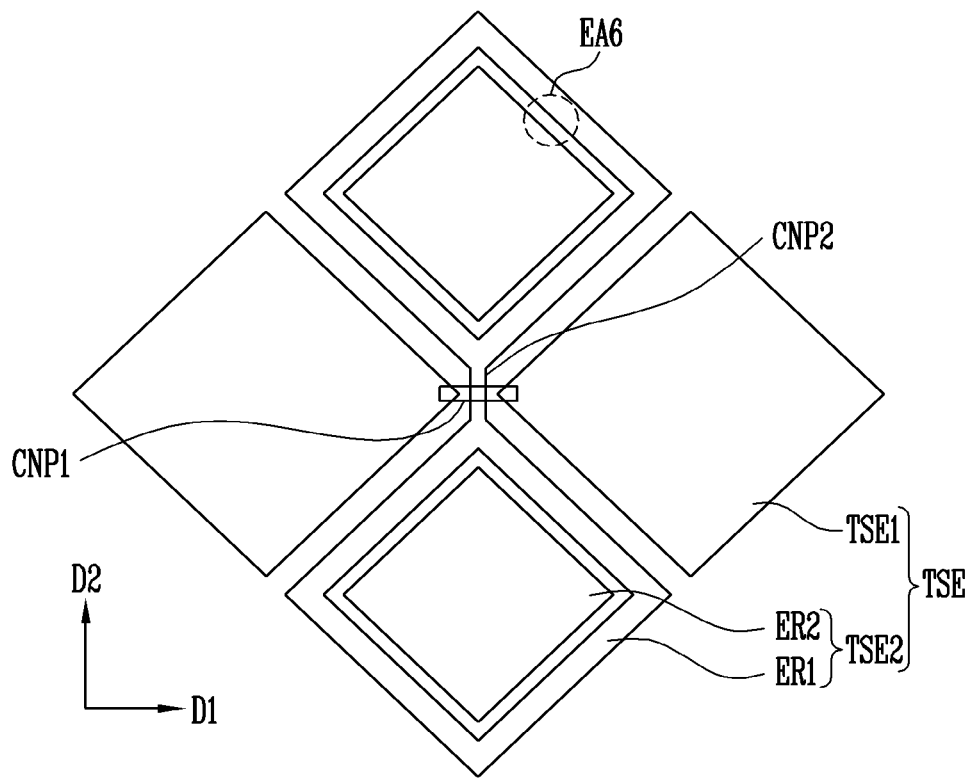
FIGS. 22, 23, and 24 illustrate the touch sensor of the display device according to an exemplary embodiment.
Figure 23:
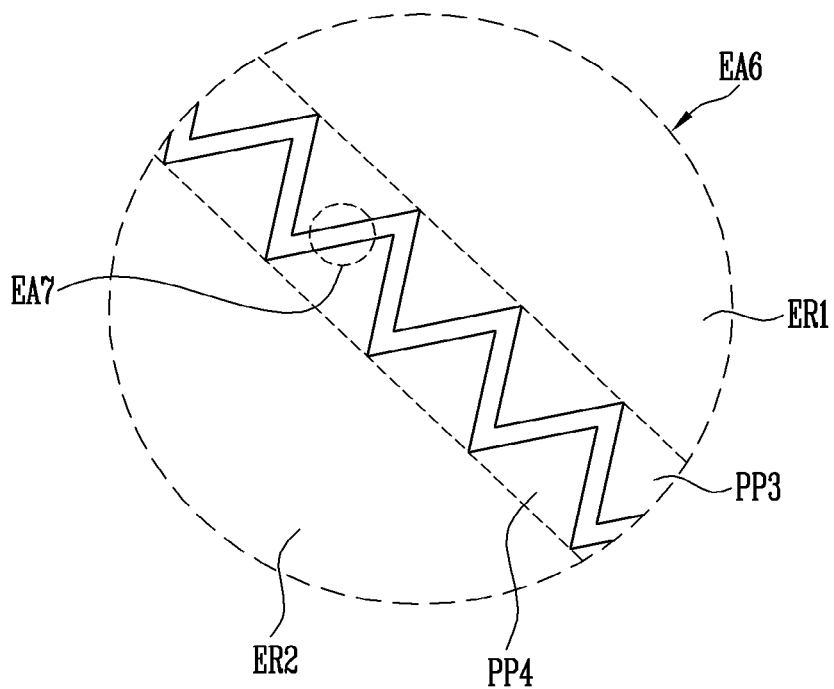
Figure 24:
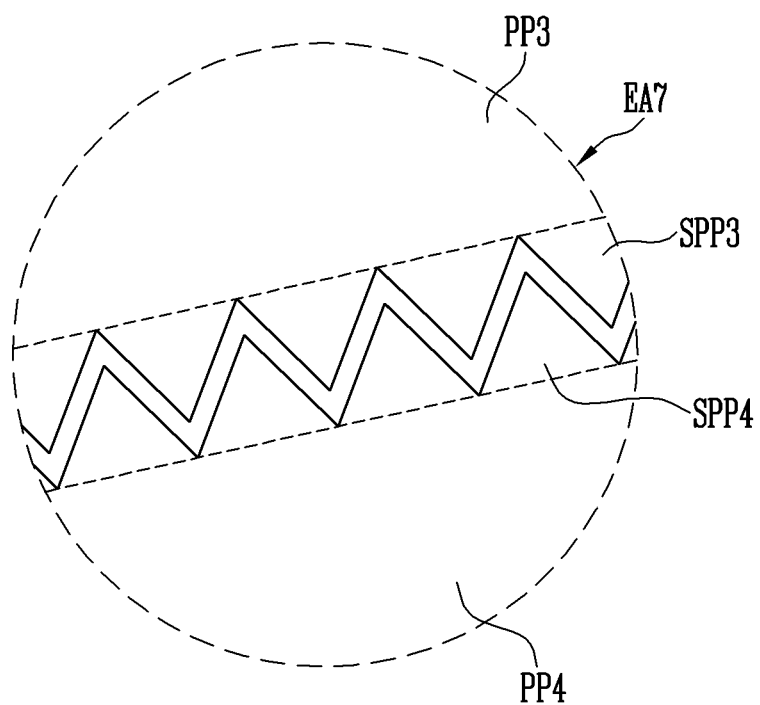

FIGS. 22 to 24 illustrate the touch sensor of the display device according to an exemplary embodiment. FIG. 22 is a partially enlarged view for illustrating the touch sensing electrodes of the touch senor shown in FIG. 2. FIG. 23 is an enlarged view of EA6 in FIG. 22. FIG. 24 is an enlarged view of EA7 in FIG. 23.

Referring to FIGS. 4, 5 and 22 to 24, the touch sensor TS provided on one surface of the display panel (refer to DPN in FIGS. 1 and 7 to 10) may include a plurality of sensing rows that include a plurality of first sensing electrodes TSE1 connected in a first direction D1, and a plurality of sensing columns that include a plurality of second sensing electrodes TSE2 connected in a second direction D2 crossing the first direction D1.

In sensing rows, the adjacent first sensing electrodes TSE1 may be electrically connected through the first connection pattern CNP1. In sensing columns, the adjacent second sensing electrodes TSE2 may be electrically connected through the second connection pattern CNP2.

Also, the surface of the first sensing electrodes TSE1 and the area of the second sensing electrodes TSE2 may be different from each other. For example, the area of the second sensing electrodes TSE2 may be smaller than the area of the first sensing electrodes TSE1.

As shown in FIG. 4, one of the adjacent first sensing electrode TSE1 and second sensing electrode TSE2, for example, the first sensing electrode TSE1, may include a plurality of u) first protrusions PP1 at the edge protruding toward another one, for example, the second sensing electrode TSE2. Also, another one of the adjacent first sensing electrode TSE1 and second sensing electrode TSE2, for example, the second sensing electrode TSE2, may include a plurality of second protrusions PP2 at the edge protruding toward the first sensing electrode TSE1. The first protrusions PP1 and the second protrusions PP2 may be alternately arranged.

Also, as shown in FIG. 5, the first protrusions PP1 may include first sub protrusions SPP1 protruding toward the second protrusions PP2 at the edge of the first protrusions PP1. The second protrusions PP2 may include second sub protrusions SPP2 protruding toward the first protrusions PP1 at the edge of the second protrusions PP2. The first sub protrusions SPP1 and the second sub protrusions SPP2 may be alternately arranged.

As described above, if the first sensing electrodes TSE1 and the second sensing electrodes TSE2 include first protrusions PP1 and second protrusions PP2, and if the first sub protrusions SPP1 and the second sub protrusions SPP2 are provided to the edges of the first protrusions PP1 and the second protrusions PP2, the distance of the line facing between the adjacent first sensing electrode TSE1 and second sensing electrode TSE2 may increase. If the length of the line facing between the adjacent first sensing electrode TSE1 and the second sensing electrode TSE2 increases, the mutual capacitance Cm of the capacitor formed between the adjacent first sensing electrode TSE1 and second sensing electrode TSE2 may increase. Also, the amount of change ΔCm in capacitance according to a user's touch may also increase. Therefore, the touch sensitivity of the touch sensor TS may improve.

The first sensing electrodes TSE1 and the second sensing electrodes TSE2 may include a plurality of conductive fine lines CFL that cross each other. For example, the conductive fine lines (refer to CFL in FIGS. 6, 14 and 15) may include a plurality of first conductive fine lines (refer to CFL1 in FIGS. 6, 14 and 15) extending in one direction and a plurality of second conductive fine lines (refer to CFL2 in FIGS. 6, 14 and 15) extending in a direction crossing the first conductive fine lines CFL1.

One of the first sensing electrodes TSE1 and the second sensing electrodes TSE2, for example, the second sensing electrodes TSE2 may include a first area ER1 and a second area ER2 electrically separated from each other. One of the first area ER1 and the second area ER2 may be provided inside of the other. For example, the second area ER2 may be provided inside the first area ER1 and electrically separated from the first area ER1.

The area where the first sensing electrodes TSE1 adjacent to the second sensing electrodes TSE2 and the capacitor are formed may be reduced by the second area ER2. If the area where the first sensing electrodes TSE1 adjacent to the second sensing electrodes TSE2 and the capacitor are formed is reduced, the capacitance of the capacitor formed between the adjacent first sensing electrode TSE1 and second sensing electrode TSE2 may be reduced. However, since the amount of change in capacitance of the capacitor is constant, the ratio of the amount of change in capacitance according to a user's touch with respect to the capacitance in a state where there is no user may increase. Therefore, the touch sensitivity of the touch sensor may be enhanced.

The first area ER1 may include a plurality of third protrusions PP3 at an edge of the first area ER1 and protruding toward the second area ER2. The second area ER2 may include fourth protrusions PP4 at an edge of the second area ER2 and protruding toward the first area ER1. Here, the third protrusions PP3 and the fourth protrusions PP4 may be alternately arranged.

Also, the third protrusions PP3 may include third sub protrusions SPP3 protruding toward fourth protrusions PP4 at an edge of the third protrusions PP3. The fourth protrusions PP4 may include fourth sub protrusions SPP4 protruding toward the third protrusions PP3 at an edge of the fourth protrusions PP4. The third sub protrusions SPP3 and the fourth sub protrusions SPP4 may be alternately arranged.

While the scope of the invention is described in detail exemplary embodiments, it is should be noted that the above-described embodiments are merely descriptive and should not be considered as limiting. Further, it should be understood by those skilled in the art that various changes, substitutions, and alterations may be made herein without departing from the scope of the exemplary embodiments as defined by the following claims.

What is claimed is:

1. A touch sensor, comprising:
a plurality of sensing rows, each sensing row comprising first sensing electrodes connected in a first direction;
a plurality of sensing columns, each sensing column comprising second sensing electrodes connected in a second direction crossing the first direction,
wherein each of the first sensing electrodes has a plurality of sides and includes first patterns protruding from one of the sides toward the second sensing electrodes,
wherein each of the second sensing electrodes has a plurality of sides and includes second patterns each having a shape complementary to a shape of each of the first patterns and formed at one of the sides thereof, and
wherein the first patterns face the second patterns, and the first patterns and the second patterns are alternately arranged.

2. The touch sensor of claim 1, wherein each of the first sensing electrodes is adjacent to adjacent second sensing electrodes in an oblique direction with respect to a boundary of the touch sensor.

3. The touch sensor of claim 1, further comprising first sub-patterns disposed at an edge of the first patterns; and
second sub-patterns disposed at an edge of the second patterns, the second sub-patterns facing the first sub-patterns disposed at an edge of an adjacent first pattern.

4. The touch sensor of claim 1, wherein an area of the first sensing electrodes is different from an area of the second sensing electrodes.

5. The touch sensor of claim 1, wherein each of the first sensing electrodes and the second sensing electrodes comprises a plurality of conductive fine lines crossing each other.

6. The touch sensor of claim 5, further comprising a pad part comprising pads electrically connected to the first sensing electrodes and the second sensing electrodes,
wherein one of the first sensing electrodes and the second sensing electrodes are configured to receive a driving signal through the pad part, and the other of the first sensing electrodes and the second sensing electrodes are configured to transmit a touch sense signal to the pad part.

7. The touch sensor of claim 6, wherein an area of each of the one of the first sensing electrodes and the second sensing electrodes configured to receive the driving signal is smaller than an area of each of the other of the first sensing electrodes and the second sensing electrodes configured to transmit the touch sense signal.

8. The touch sensor of claim 7, wherein the one of the first sensing electrodes and the second sensing electrodes configured to receive the driving signal comprise a first area and a second area, the first area and the second area being electrically separated from each other,
wherein one of the first area and the second area is inside the other of the first area and the second area and electrically insulated.

9. The touch sensor of claim 8, further comprising:
third patterns disposed at an edge of the first area and protruding toward the second area; and
fourth patterns disposed at an edge of the second area and facing the third patterns disposed at an edge of an adjacent first area.

10. The touch sensor of claim 9, further comprising:
third sub-patterns disposed at an edge of the third patterns; and
fourth sub-patterns disposed at an edge of the fourth patterns, the fourth sub-patterns facing the third sub-patterns disposed at an edge of an adjacent third pattern.

11. The touch sensor of claim 1, wherein a distance between adjacent first patterns is equal to or smaller than 1/6 of a length of one side of each of the first sensing electrodes.

12. The touch sensor of claim 11, wherein a number of the first patterns disposed at one side of each of the first sensing electrodes is 6 or more.

13. The touch sensor of claim 11, wherein a distance between adjacent second patterns is equal to or smaller than 1/6 of a length of one side of each of the second sensing electrodes.

14. The touch sensor of claim 13, wherein a number of the second patterns disposed at one side of each of the second sensing electrodes is 6 or more.

15. The touch sensor of claim 5, wherein a pitch of the first patterns and a pitch of the second patterns are equal to or smaller than 5 mm.

16. The touch sensor of claim 5, wherein the first patterns, the second patterns, the first sub-patterns, and the second sub-patterns have a closed curve shape with a straight side.

17. The touch sensor of claim 5, further comprising dummy fine lines disposed between a first sub-pattern and a second sub-pattern adjacent to the first sub-pattern.

18. The touch sensor of claim 5, wherein a height of one of the first patterns is different from a height of the other of the first patterns, and a height of one of the second patterns is different from a height of the other of the second patterns.

19. The touch sensor of claim 5, wherein a width of one of the first patterns is different from a width of the other of the first patterns, and a width of one of the second patterns is different from a width of the other of the second patterns.

20. The touch sensor of claim 5, wherein the conductive fine lines comprise first conductive fine lines extending in the first direction and second conductive fine lines crossing the first conductive fine lines.

21. The touch sensor of claim 20, further comprising a dummy portion disposed between a first sensing electrode and a second sensing electrode adjacent to the first sensing electrode, the dummy portion comprising at least one dummy pattern, wherein the at least one dummy pattern comprises:
at least one first dummy conductive fine line parallel to the first conductive fine lines; and
a plurality of second dummy conductive fine lines crossing the first dummy conductive fine line and parallel to the second conductive fine lines.

22. The touch sensor of claim 21, wherein the dummy portion comprises two dummy patterns.

23. The touch sensor of claim 21, wherein the at least one dummy pattern comprises two first dummy conductive fine lines, wherein the second dummy conductive fine lines cross all of the first dummy conductive fine lines.

24. A touch sensor, comprising:
a plurality of sensing rows, each sensing row comprising first sensing electrodes connected in a first direction; and
a plurality of sensing columns, each sensing column comprising second sensing electrodes connected in a second direction crossing the first direction,
wherein each of the first sensing electrodes has a plurality of sides and includes first patterns protruding from one of the sides toward the second sensing electrodes,
wherein each of the second sensing electrodes has a plurality of sides and includes second patterns facing the first patterns and disposed at one of the sides thereof, and
wherein the first patterns and the second patterns are alternately arranged.

\* \* \* \* \*